(12) United States Patent
Ulug

(10) Patent No.: US 6,882,876 B2
(45) Date of Patent: Apr. 19, 2005

(54) DIAGNOSIS OF NORMAL PRESSURE HYDROCEPHALUS BY AUTOMATED PROCESSING OF MR IMAGES

(75) Inventor: Aziz M. Ulug, Edison, NJ (US)

(73) Assignee: Cornell Research Foundation, Inc., Ithaca, NY (US)

( * ) Notice: Subject to any disclaimer, the term of this patent is extended or adjusted under 35 U.S.C. 154(b) by 427 days.

(21) Appl. No.: 10/104,429

(22) Filed: Mar. 22, 2002

(65) Prior Publication Data

US 2002/0177760 A1 Nov. 28, 2002

Related U.S. Application Data

(60) Provisional application No. 60/279,138, filed on Mar. 27, 2001.

(51) Int. Cl.$^7$ .............................................. A61B 5/05
(52) U.S. Cl. ...................................... 600/410; 600/419
(58) Field of Search ............................... 600/410, 407, 600/411, 419, 436; 324/307, 388, 309; 435/6

(56) References Cited

U.S. PATENT DOCUMENTS

| | | | | |
|---|---|---|---|---|
| 4,608,992 A | * | 9/1986 | Hakim et al. ................ | 600/431 |
| 4,663,591 A | * | 5/1987 | Pelc et al. .................... | 324/309 |
| 4,684,891 A | * | 8/1987 | Feinberg ....................... | 324/309 |
| 5,617,861 A | * | 4/1997 | Ross et al. .................... | 600/410 |
| 6,163,152 A | * | 12/2000 | Bernstein et al. ............ | 324/306 |
| 6,198,289 B1 | * | 3/2001 | Du et al. ....................... | 324/322 |
| 6,463,315 B1 | * | 10/2002 | Klingberg et al. ........... | 600/410 |
| 6,670,812 B1 | * | 12/2003 | Mock et al. ................... | 324/309 |

OTHER PUBLICATIONS

Chun et al. American Journal of Neuroradiology 21:1078–1083(6 2000) c 2000.*

William G. Bradley, M.D., Ph.D., Normal Pressure Hydrocephalus: New Concepts On Etiology And Diagnosis, *American Journal of Neuroradiology* 21:1586–1590 (10 2000 ), US.

Aziz M. Uluǧ, Christopher G. Filippi, Mark Souweidane, Robert D. Zimmerman, Use of Diffusion Imaging for Assessing the Treatment of Obstructive Hydrocephalus, *Proc. Intl. Magn. Reson. Med 7*, p923 (1999) US.

S. Hakim and R. D. Adams, The Special Clinical Problem of Symptomatic Hydrocephalus with Normal Cerebrospinal Fluid Pressure—Observations on Cerebrospinal Fluid Hydrodynamics, *Journal of the Neurological Sciences*, 2: 307–327 (1965) US.

* cited by examiner

*Primary Examiner*—Daniel Robinson
(74) *Attorney, Agent, or Firm*—Leydig, Voit & Mayer, Ltd

(57) ABSTRACT

A method useful in diagnosing normal pressure hydrocephalus and monitoring treatment is presented. A database of mean brain diffusion constants and distribution width is created. Three-dimensional diffusion images of the subject are obtained and algorithms are applied to the images, which include reducing the three-dimensional images to one-dimensional maps of the average diffusion content for the entire brain. Distribution maps (diffusion histograms) are obtained for the brain, and the histograms are fit to a model. From the fit are obtained a mean brain diffusion constant, which is characteristic of the diffusion of the brain tissue in the three compartment model, and a distribution width for the tissue. These numbers are compared to the database for normals, and the significant deviation from the normals (higher in the case of mean brain diffusion constant and wider in the case of distribution width) is an indicator of the presence of normal pressure hydrocephalus.

25 Claims, 17 Drawing Sheets

3-Compartment decomposition of diffusion histogram

DIAGNOSIS OF NORMAL PRESSURE HYDROCEPHALUS BY AUTOMATED PROCESSING OF MR IMAGES

CROSS-REFERENCE TO RELATED PATENT APPLICATIONS

This patent application claims the benefit of U.S. provisional patent application No. 60/279,138, filed Mar. 27, 2001.

FIELD OF THE INVENTION

The present invention relates to medical diagnosis and more particularly to diagnosis of normal pressure hydrocephalus.

BACKGROUND OF THE INVENTION

Normal pressure hydrocephalus (NPH) is a clinical syndrome characterized by enlargement of the brain's ventricular spaces without obstruction of cerebrospinal fluid (CSF) or elevation in CSF pressure. This condition may develop from a variety of processes that cause decreased resorption or over-production of CSF. The net effect of NPH is a reduction in the compliance of the brain parenchyma resulting in an increased susceptibility to brain injury. NPH is often associated with disturbances in gait, urinary continence and cognitive abilities.

It is known that the diffusion of water in the periventricular region is altered in hydrocephalic patients due to transependymal resorption of CSF. This fluid diffuses away from the ventricular surface producing increased extracellular water in the periventricular white matter (PVWM). Thus it is known that the average diffusion constant of the PVWM in hydrocephalic patients is increased compared to normals. Using magnetic resonance imaging (MR) and utilizing skill and judgment of the diagnostician in isolating an appropriate region of interest (ROI), it is possible to observe the evidence of this increased average diffusion content of the PVWM. However, as a useful tool in diagnosis, this procedure has its limitations.

BRIEF SUMMARY OF THE INVENTION

The present invention is built on my successful test of the hypothesis that transependymal resorption of ventricular fluid leads to increased water content throughout the brain instead of only in the PVWM regions.

In view of the foregoing, it is a general aim of the present invention to quantify the mean brain diffusion constant in NPH patients for comparison with normative values.

A further general aim of the present invention is to diagnose normal pressure hydrocephalus by MR using post processing algorithms.

A further general aim of the present invention is to monitor the treatment response of individuals diagnosed as having normal pressure hydrocephalus by MR using post processing algorithms.

Further in that regard, it is an object the utilize post processing algorithms which employ quantitative diffusion maps of the entire brain derived from the MR diffusion images.

An object according to the present invention is to utilize microstructure information obtained from quantitative diffusion maps, and reduce that information to a single microstructurally important brain parameter useful in diagnosing NPH.

A further and detailed objective is to utilize a process which is totally automated, and applied to normal diffusion images, in contrast to ROI measurements which possibly suffer from operator bias.

Other objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings.

Figure 1:
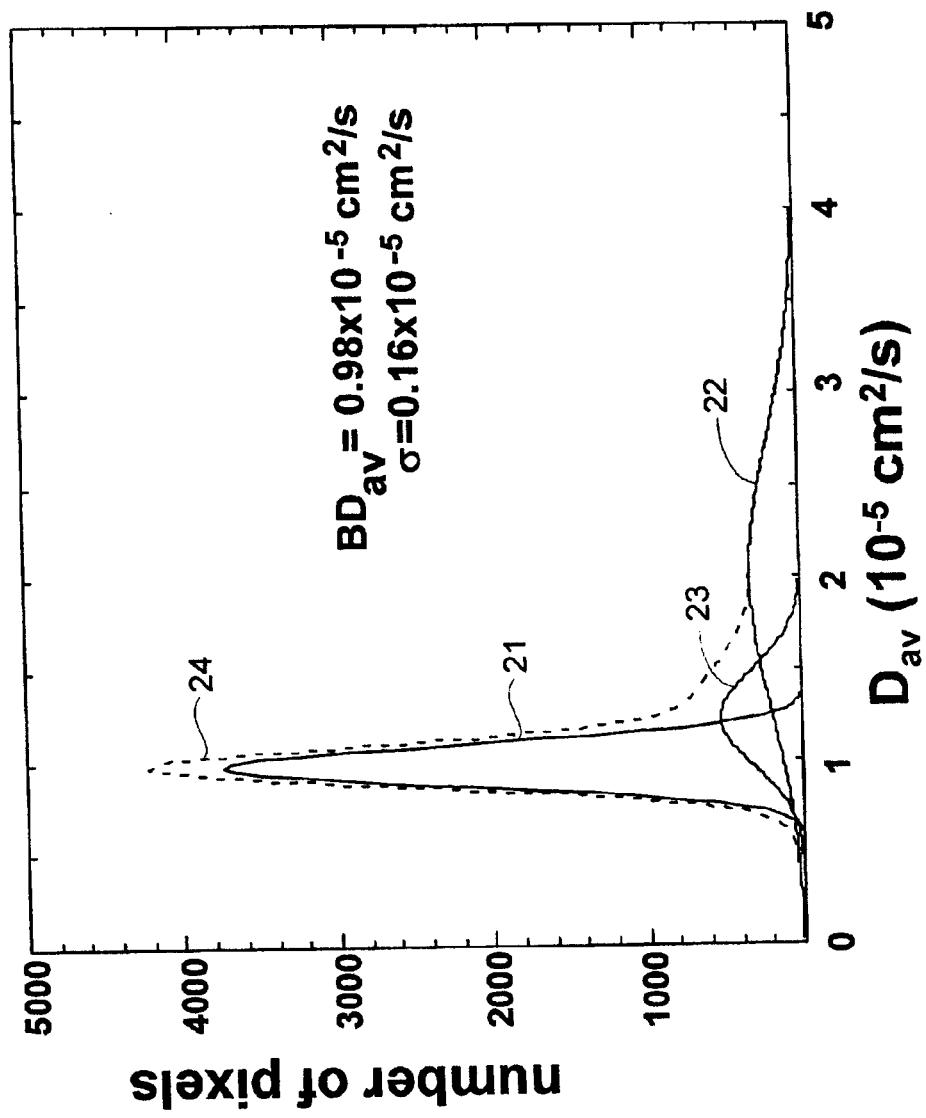
FIG. 1 is a diagram illustrating the three compartment decomposition model for the diffusion histograms.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE EMBODIMENTS

MR images obtained from a number of patients were processed in accordance with this invention as will be described in detail below. With respect to the images themselves, the following equipment and techniques were used.

The images were obtained using a 1.5 T GE Signa Echospeed MR scanner. An EPI multi-slice sequence (TE100=ms, TR=6 s, 128×128, FOV=22 cm, 5 mm thick, 30 slices) was used to acquire axial diffusion images of entire brain. Diffusion was measured in 3 directions (x, y, z) for most subjects with a b-value of 100,000 s/cm² in each direction. An image without diffusion gradients also was acquired.

Using diffusion-weighted images, typically in three orthogonal directions, an orientation-independent diffusion-weighted image ($DWI_{trace}$), which is related to the trace of the diffusion tensor, is obtained on the scanner as follows:

$$DWI_{trace} = \sqrt[3]{DWI_x DWI_y DWI_z}$$

This trace-weighted image along with the image acquired without diffusion weighting ($S_0$) is transferred from the scanner to a separate processor or computer configuration. Of course, the MR scanner processor could also be employed for this processing, and the invention is intended to cover both alternatives. The invention is operational with numerous other general purpose or special purpose processors or computer configurations. Examples of well known processors and/or computer configurations that may be suitable for use with the invention include, but are not limited to, personal computers, server computers, hand-held or laptop devices, multiprocessor systems, microprocessor-based systems, network PCs, minicomputers, mainframe computers, peripherals (e.g., scanner, data acquisition system, video card, network interface card, etc.) and the like. Programs operating on the processor are generally stored on computer readable media. Computer readable media can be any available media that can be accessed by the processor and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the processor. By way of example, and not limitation, communication media includes wired media such as a wired network or direct-wired connection, and wireless media such as acoustic, RF, infrared and other wireless media. Combinations of the any of the above should also be included within the scope of computer readable media.

A program operating on the processor employs the equation $$DWI_{trace} = S_0 \exp(-bD_{av})$$

to calculate the orientation-independent average diffusion maps ($D_{av}$=Trace/3) on a pixel-by-pixel basis.

A further process is then performed on the data in order to calculate the diffusion distribution maps (histograms) from the entire brain ($BD_{av}$). The program, in this particular implementation, is adapted to distribute the pixels to 250 bins with bin widths of $0.02 \times 10^{-5}$ cm²/s. This distribution map or histogram is fitted to a triple gaussian curve using commercially available software. The equation of the curve is stated as follows:

$$F(D_{av}) = C_1 \exp(-[(D_{av} - BD_{av})/\sigma]^2) + C_2 \exp(-[(D_{av} - D_2)/\sigma_2]^2) + C_3 \exp(-[(D_{av} - D_3)/\sigma_3]^2)$$

This curve represents a two-compartment model with mixing (i.e., a three compartment model), as illustrated in FIG. 1. Turning to FIG. 1, there is shown a plot or histogram showing the diffusion weighted average distribution histogram for a typical brain. It will be seen that a first compartment 21 has a very sharply peaked characteristic in the present example approaching 4,000 pixels. This is the tissue compartment for the model. A second much broader peak 22 represents the CSF compartment. A third peak 23 is identified as the partial volume compartment which consists of pixels that contain both tissue and CSF. The curve 24 represents the sum of the three characteristics. Peak locations and peak widths are determined from the fitted data. The brain tissue compartment has a narrow distribution of values around its mean. The second and third compartments 22, 23 have broader distributions. The mean of the brain tissue pixel distribution (also mode of the entire distribution) is recognized as a mean diffusion constant for the entire brain ($BD_{av}$). The distribution width ($\sigma$) of the brain tissue compartment is also recorded. Because the diffusion constant of CSF is more than four times higher than that of the brain tissue, the tissue pixels contaminated with more than ten percent CSF are included in the broad mixing compartment. Hence, the measured $BD_{av}$ with $\sigma$ characterizes the brain tissue pixels that are not contaminated with CSF.

To summarize, the original diffusion imaging data is in the form of three-dimensional information, with multiple images resulting from multiple gradients. That information is processed to provide a distribution analysis which is, in effect, one dimensional information. That information is modeled, as described above, to produce a number (or a pair of numbers) which describe the information, the number being $BD_{av}$ and $\sigma$. $BD_{av}$ can be characterized as the mean diffusion constant for the entire brain tissue, and $\sigma$ as the distribution width of that diffusion constant for the brain tissue.

Histogram analysis is an effective technique for assessing overall brain diffusion changes. By sorting pixels according to $D_{av}$, contaminating factors such as lacunes and Virchow-Robin spaces can be removed. These regions are sometimes unintentionally included in ROI measurements, causing elevations of $D_{av}$ values. Histograms distribute these pixels of high diffusion intensity to the right, removing their effect on tissue $D_{av}$ measurements. The histograms we have utilized have a gaussian distribution for $D_{av}$ for brain tissue which is expected for the brain with a relatively homogeneous distribution of tissue water.

Using the techniques described above, data was obtained from three distinct groups of subjects. The data was obtained in most cases from previously obtained MR images of patients. Diagnosis for the patients was made on the basis of clinical and imaging findings. The patients were broken down into the following three groups:

1. A normal control group of 38 subjects. These subjects are not known to have any neurological disease and likely represent normal values.

2. An Alzheimer control group of four subjects. These subjects are likely to have Alzheimer disease a definite diagnosis requires post-mortem histopathology. These patients are included as controls because sometimes patients with Alzheimer disease may be erroneously diagnosed as NPH or vice versa.

3. An NPH group of 15 subjects. These subjects are likely to have NPH. However, since NPH is a clinical diagnosis depending on a patient's symptoms and/or imaging findings, this group may well include some non-NPH patients. A reliable diagnosis may require invasive procedures such as a spinal tap or surgical placement of a ventricular shunt.

Figure 2:
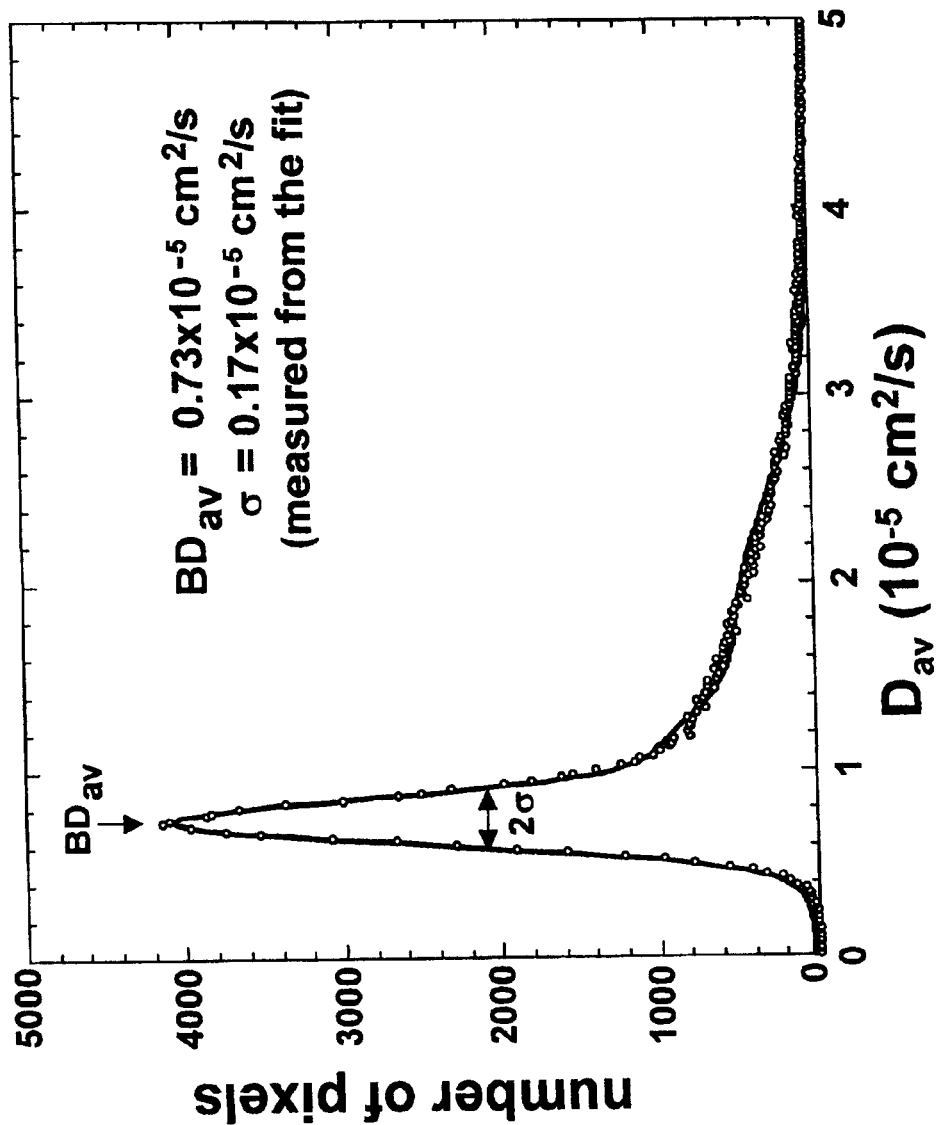
FIG. 2 shows a histogram of a typical normal individual.

FIG. 2, for orientation, shows a histogram and the derived characterizing parameters ($BD_{av}$ and $\sigma$) for a typical "normal" patient. The individual data points are shown as circles and the fit to the three compartment gaussian model is shown by the solid line. The $BD_{av}$ and $\sigma$ parameters are determined from the fit. It will be seen for the normal individual the $BD_{av}$ was calculated to be $0.73 \times 10^{-5}$ cm$^2$/s and $\sigma$ to be $0.17 \times 10^{-5}$ cm$^2$/s.

Figure 3:
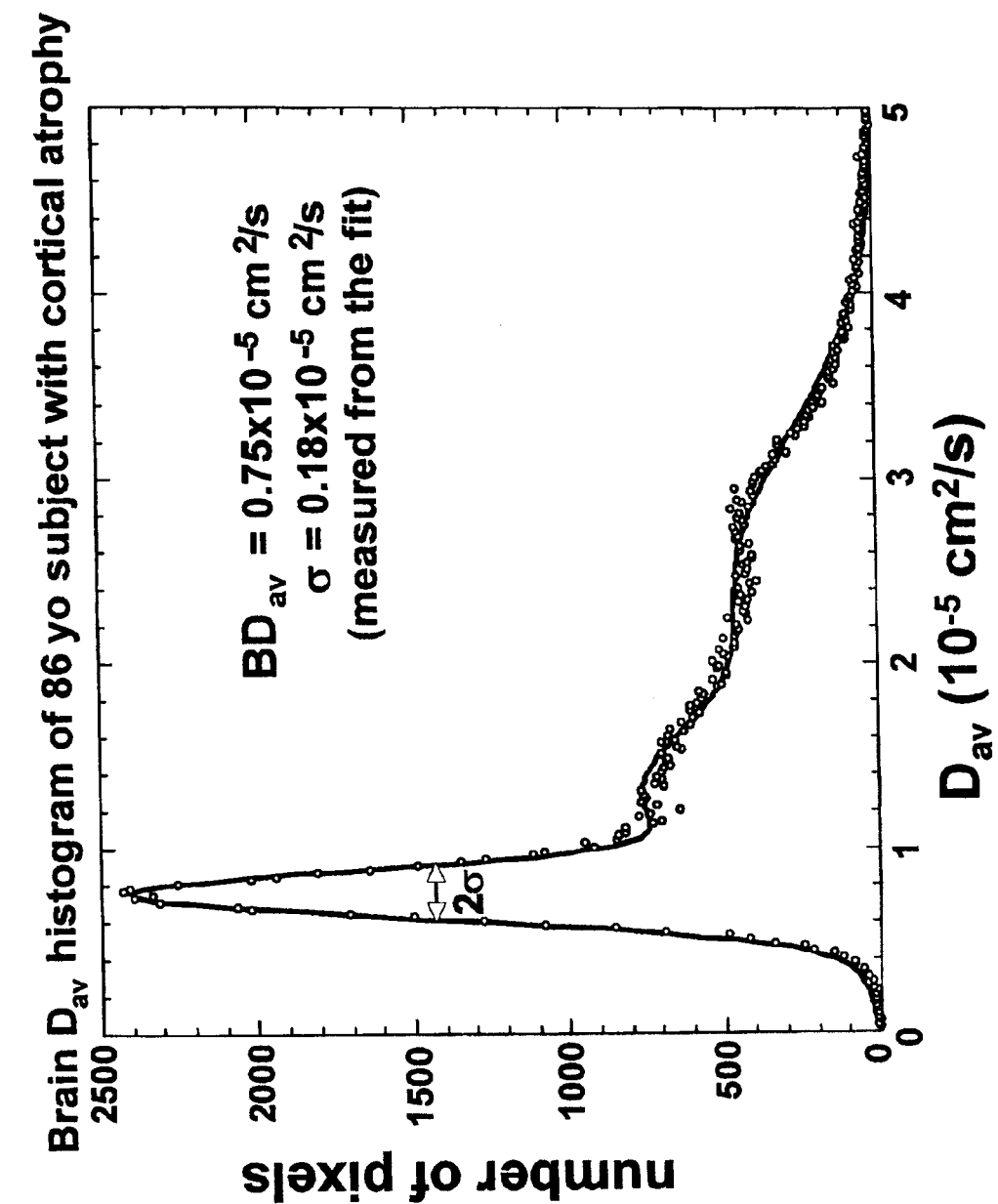
FIG. 3 shows a histogram of a subject with cortical atrophy.

For comparison, FIG. 3 shows a similar histogram for a subject with cortical atrophy. The $BD_{av}$ and $\sigma$ numbers are similar to those of the normal patient, although the pixel distribution is substantially different, with a much lower peak in the tissue compartment and a much broader tail in the partial volume compartment.

Figure 4:
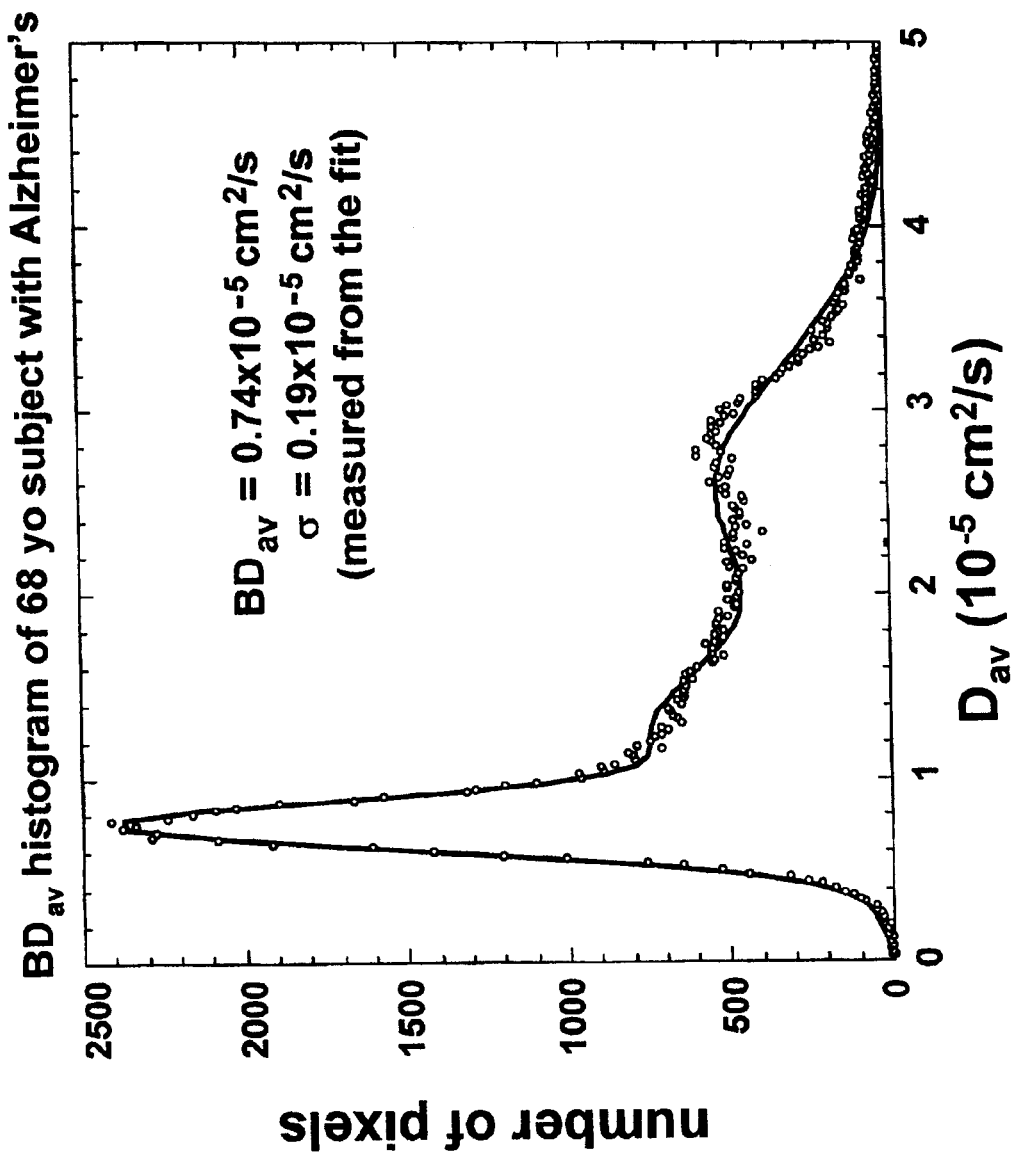
FIG. 4 shows a histogram of a subject with Alzheimer's.

FIG. 4 shows a similar histogram for a subject with Alzheimer's. Again, the $BD_{av}$ and $\sigma$ are very much like those of FIGS. 2 and 3, even though the overall curve is much different from the normal.

Figure 5:
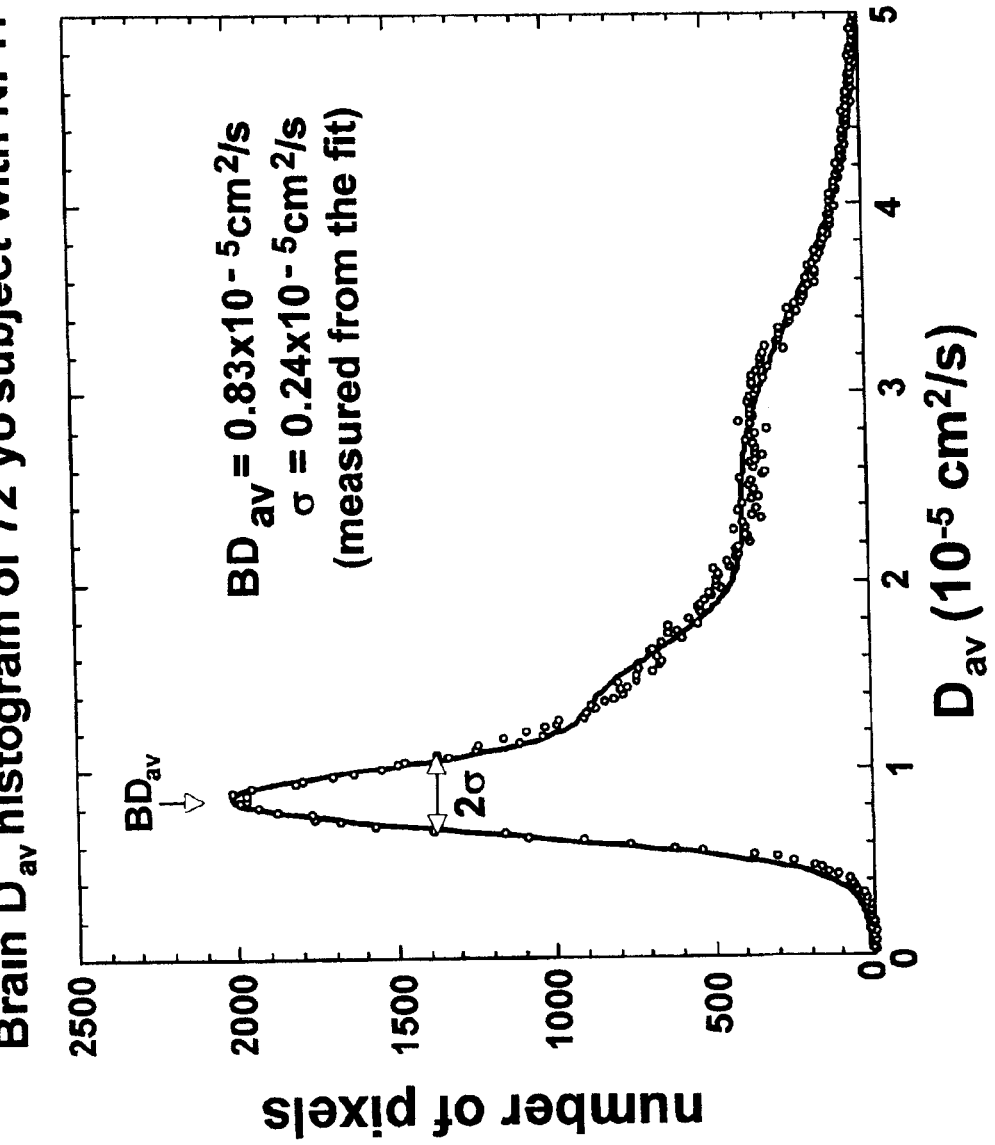
FIG. 5 shows a histogram of a subject with NPH.

In practicing the invention, FIG. 5 represents what we have found to be a typical histogram for a subject with NPH. It will be seen that a $BD_{av}$ for that patient was found to be $0.83 \times 10^{-5}$ cm$^2$/s, and the $\sigma$ to be $0.24 \times 10^{-5}$ cm$^2$/s. Thus the average brain diffusion constant was found to be significantly higher than the normal, and the distribution width was wider than the normal.

Figure 6:
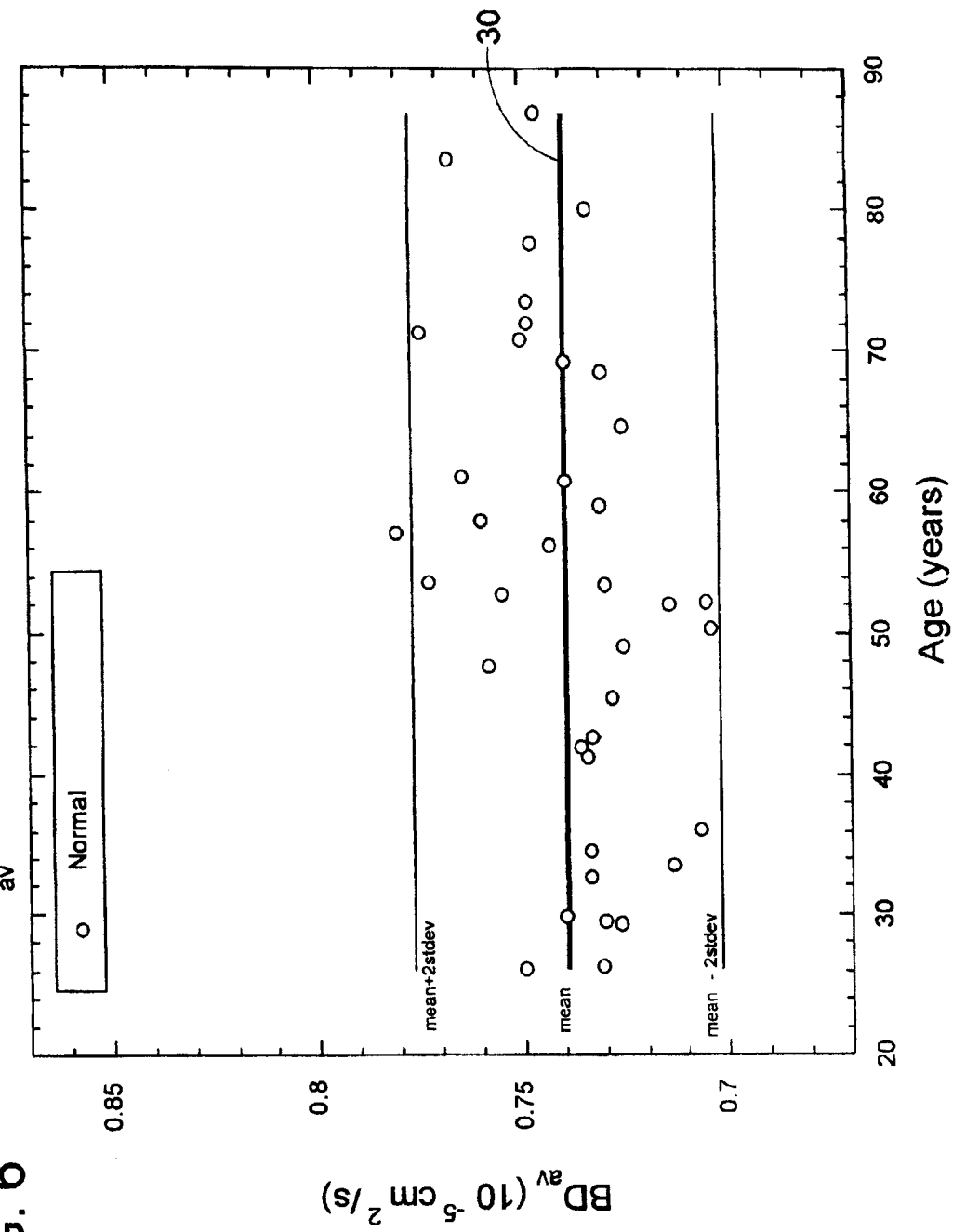
FIG. 6 shows the distribution of the mean brain diffusion constant ($BD_{av}$) for the normal population considered in the test.

As noted earlier, a larger group of subjects was tested, and the results support the fact of higher brain diffusion constants and wider distributions for subjects with NPH as compared to normals. FIG. 6 shows the data points which produced a mean distribution for the 38 normal subjects in this test. The mean curve is identified by the reference numeral 30 and will be utilized in FIG. 7 to compare with the data for NPH patients. In a similar fashion, the distribution data for the 38 patients was compared to produce a mean curve which will also be compared with the distribution for the NPH patients.

Figure 7:
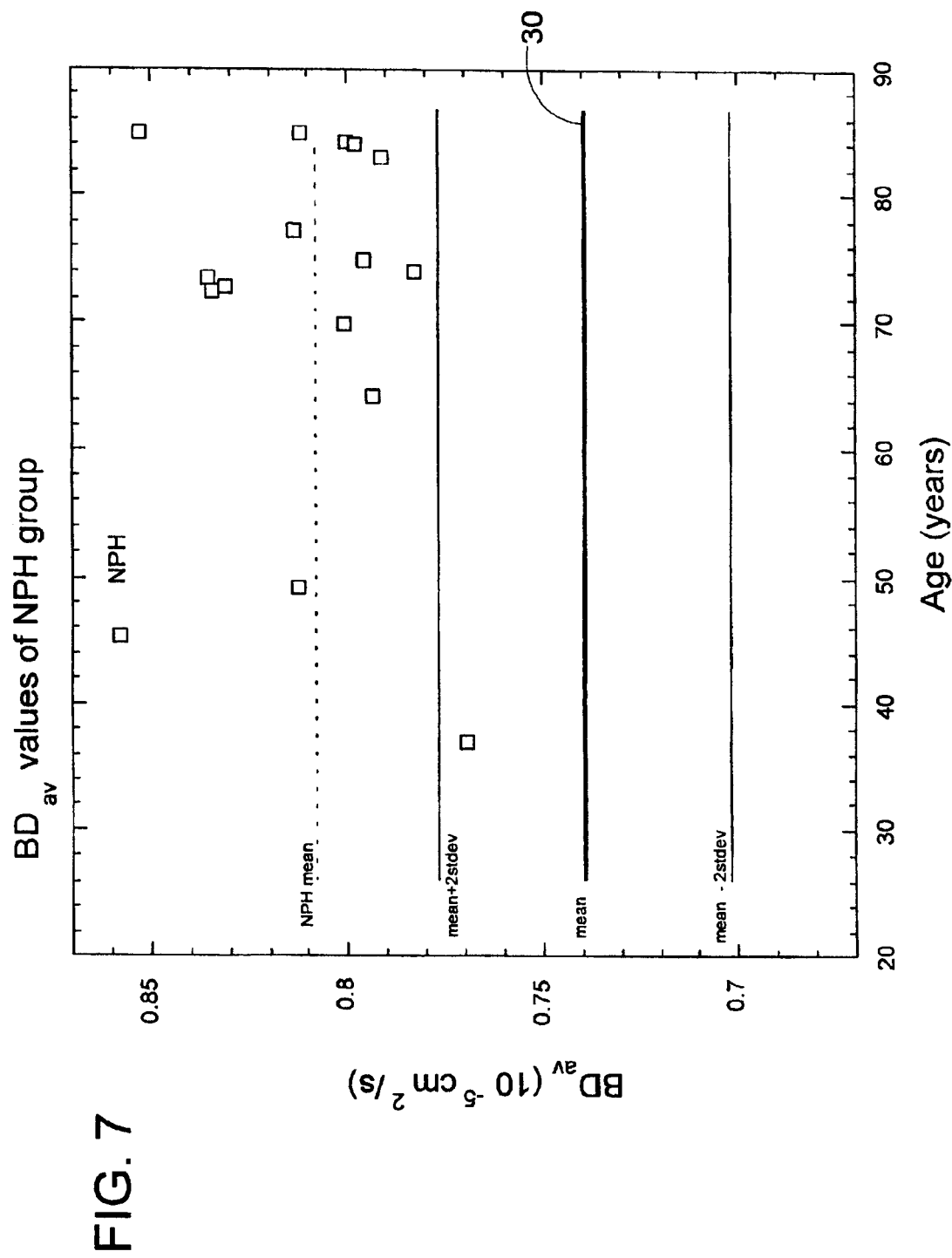
FIG. 7 shows the distribution (with respect to age) of the mean brain diffusion constant ($BD_{av}$) for the NPH subjects considered in the test.
Figure 8:
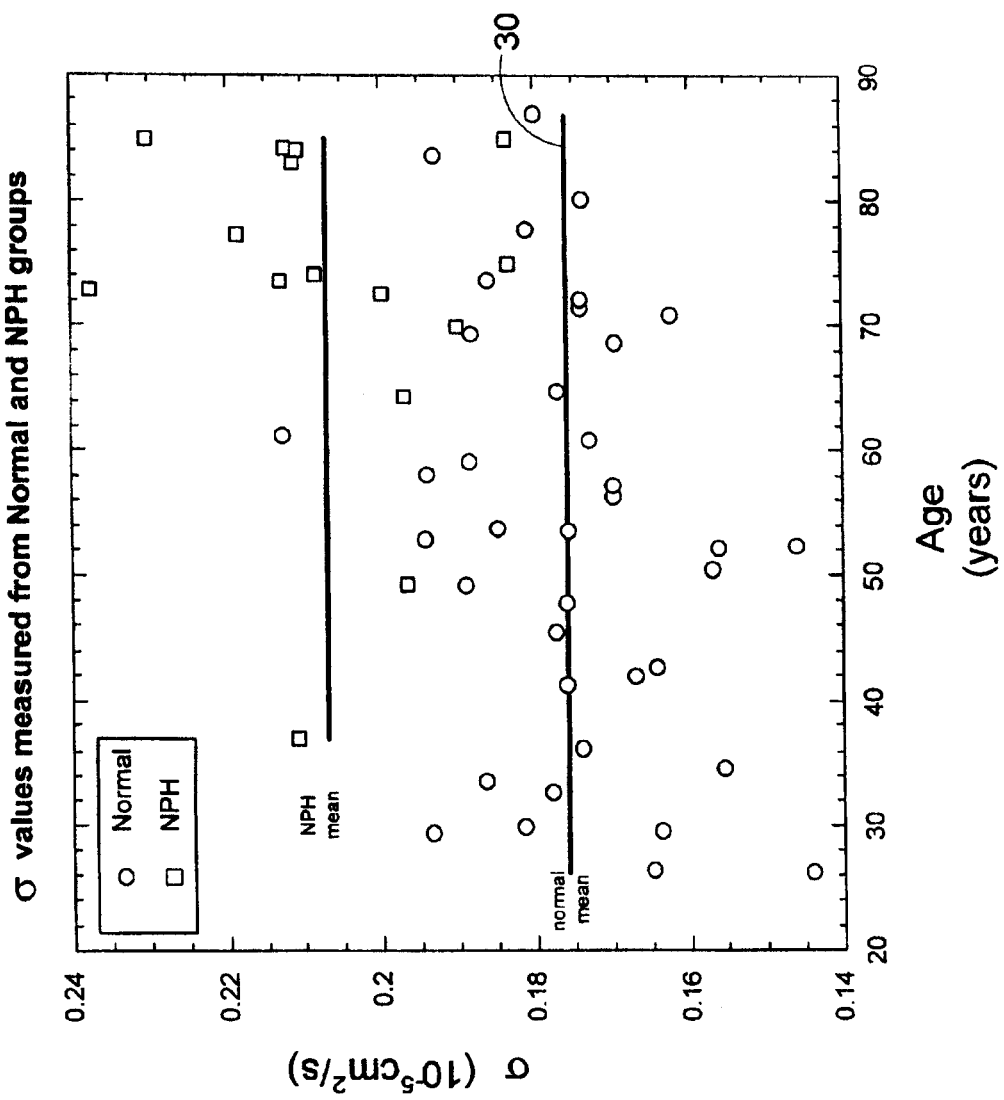
FIG. 8 shows the distribution width $\sigma$ of the mean brain diffusion constant for the normal population and NPH subjects in the study.

In practicing the invention, we have generated data which allows the comparison of brain diffusion constants and distribution between patients suspected of NPH and normal patients to isolate those likely to have NPH. FIG. 7 shows the data for the 15 subjects of the NPH group as compared to the mean 30 for the group of 38 normal subjects. It will be seen that in all cases the diffusion constant is higher by a significant factor than the mean for the normal subjects. FIG. 8 shows the results with respect to the distribution width $\sigma$ for the diffusion constant for the NPH patients as compared to a mean for the normal patients. Again the distribution width is found to be broader than that for the mean of normal patients.

Table 1 sets out a summarization of the data which was developed by the inventor:

TABLE 1

| | $BD_{av}$ | $\sigma$ |
|---|---|---|
| Normal control (n = 38) | 0.739 ± 0.019 | 0.175 ± 0.014 |
| Alzheimer control (n = 4) | 0.757 ± 0.015 | 0.192 ± 0.007 |

TABLE 1-continued

| | $BD_{av}$ | $\sigma$ |
|---|---|---|
| NPH group (n = 15) | 0.808 ± 0.022 | 0.207 ± 0.016 |
| % increase compared to normal | 9.3% | 17.8% |

The measured parameters are reported in the units of $10^{-5}$ cm$^2$/s. The mean and standard deviations of the calculated parameters are shown. When normal group is compared with NPH group the differences are statistically significant at $p < 0.05$ level.

Figure 9:
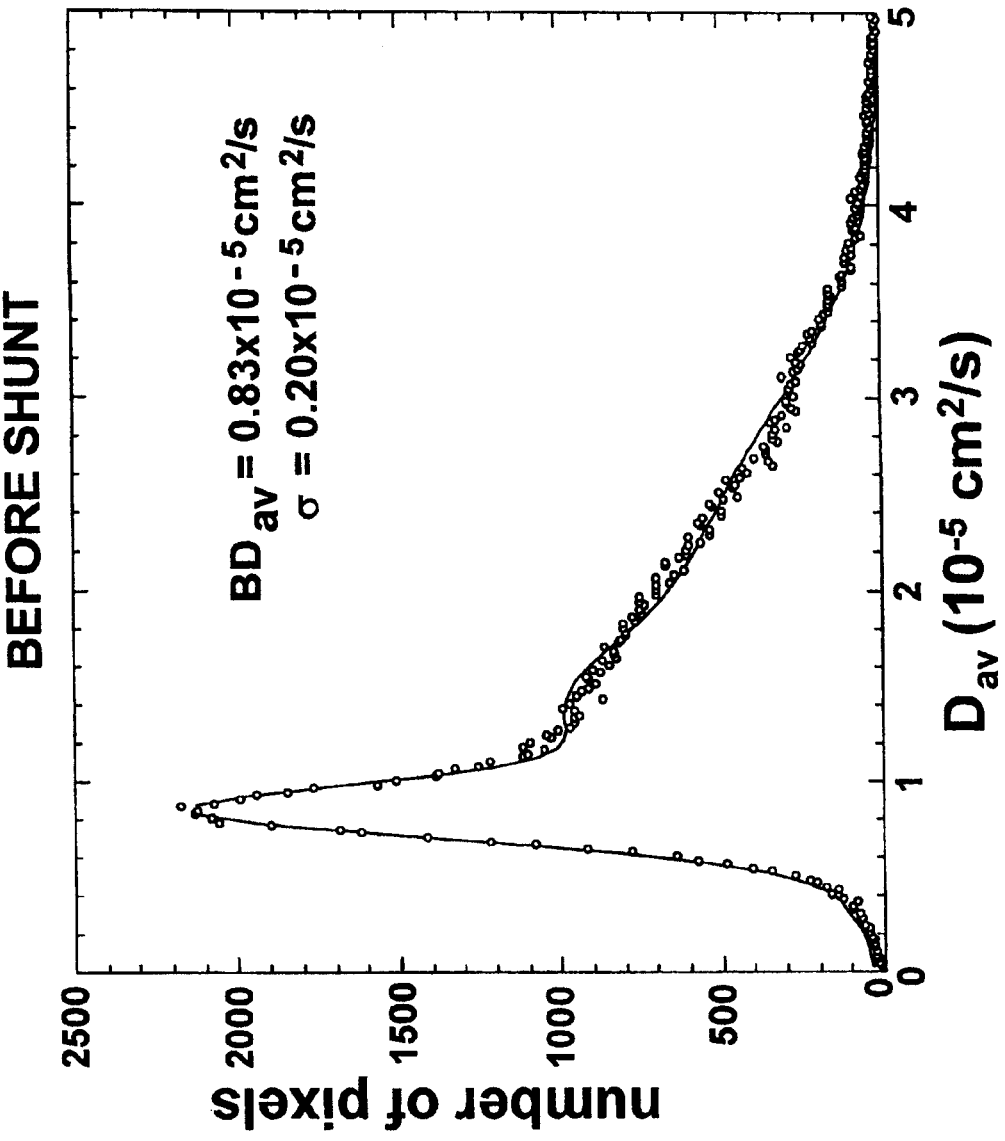
FIGS. 9–11 show histograms for a particular NPH patient, before shunt (FIG. 9), after shunt (FIG. 10), and after shunt disabled (FIG. 11)
Figure 10:
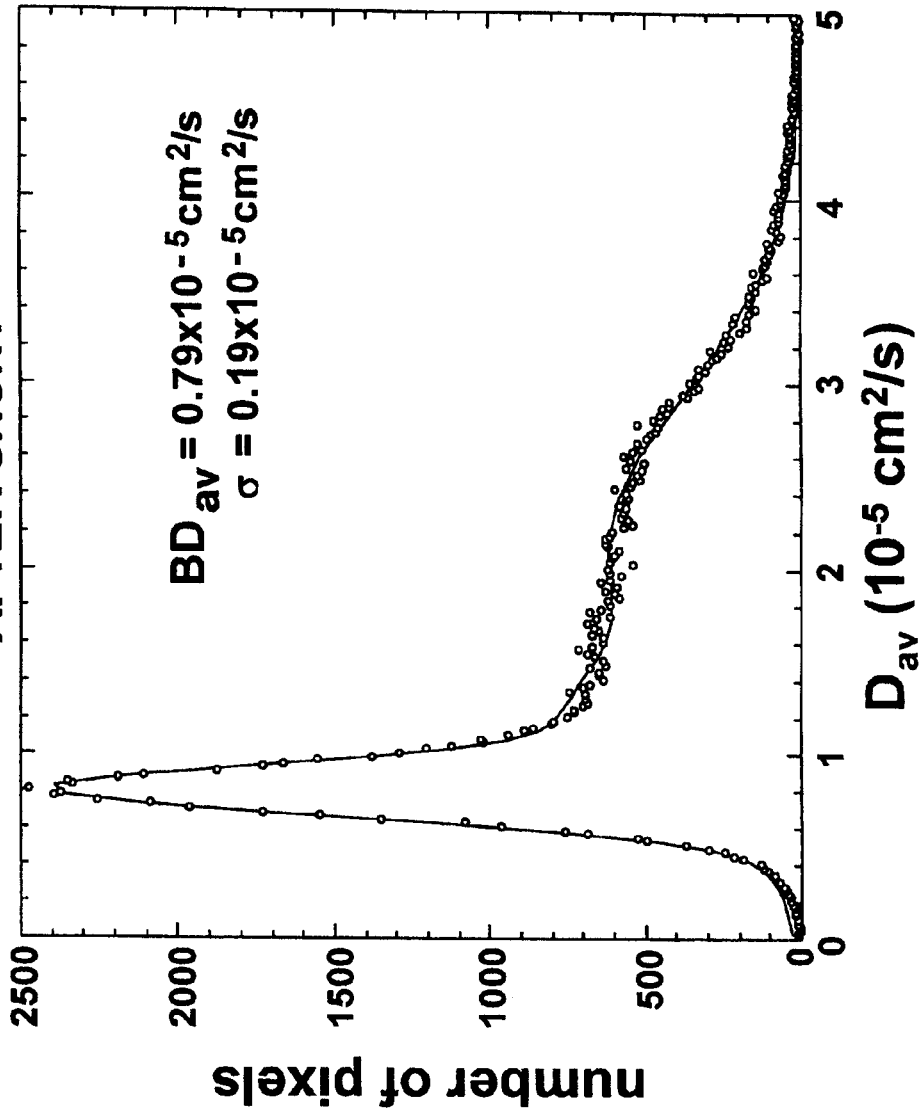
Figure 11:
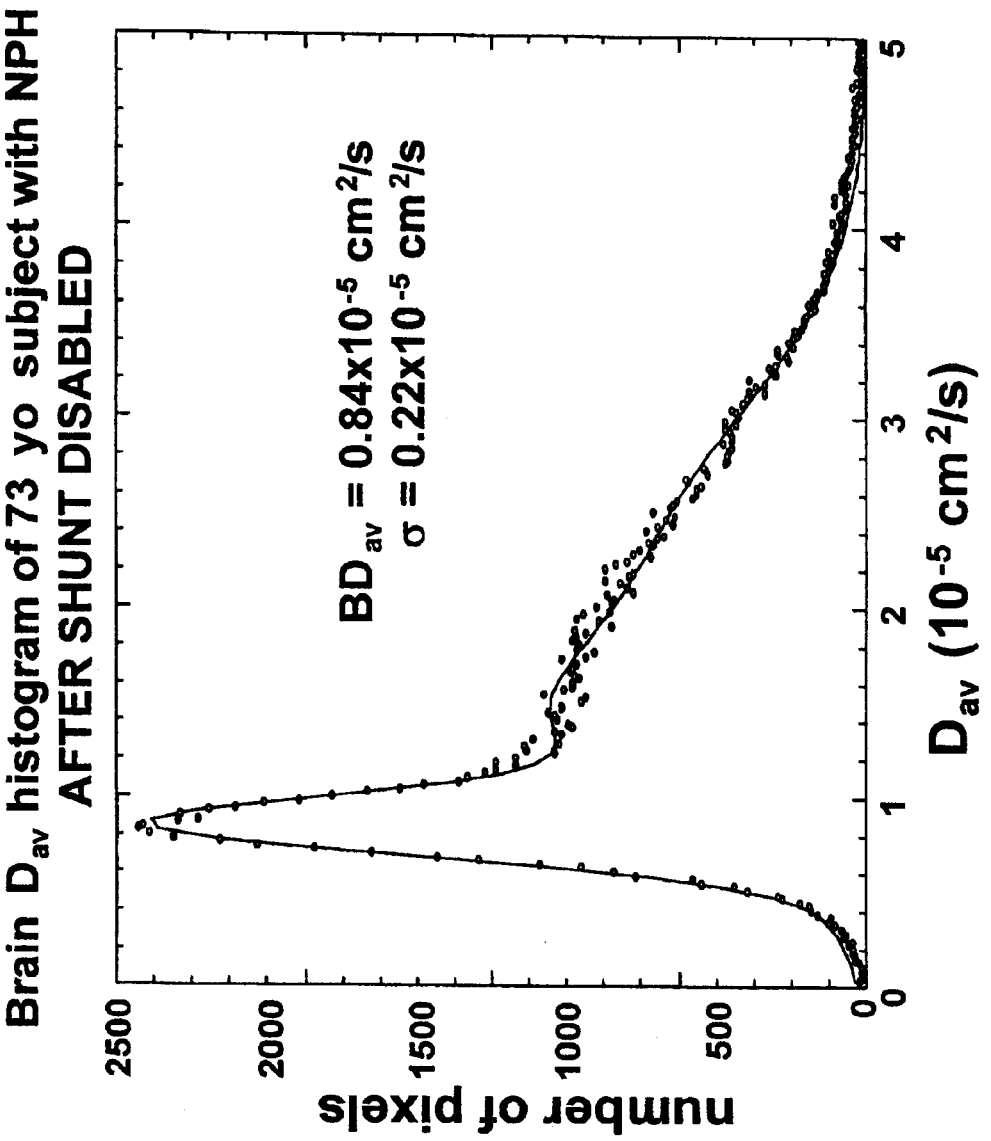

FIGS. 9–11 provide additional support for our conclusion that the $BD_{av}$, the mean diffusion constant for the entire brain tissue, and its distribution can be compared to normal values to determine the likelihood of NPH for the subject. FIG. 9 shows a histogram for an NPH subject before surgical procedures were undertaken to introduce corrections. The standard treatment for NPH is the surgical placement of a shunt for draining the CSF for recirculation. It will be seen that the data is characteristic of the mean brain diffusion constant and distribution set out in FIGS. 7 and 8. A surgical procedure was performed to install a shunt for draining the CSF for recirculation. FIG. 10 shows data produced from images taken from the patient after the shunt was installed. It will be seen that the brain diffusion constant and distribution are characteristic of the normal group. The shunt was temporarily disabled for clinical reasons and a further set of scans taken while the shunt was disabled. FIG. 11 shows the data produced in this condition, again showing the average distribution constant for the brain and its distribution to be characteristic of the NPH group.

Additional data was generated that provides support that the mean brain diffusion constant $BD_{av}$ and its distribution can be compared to normal values to determine the likelihood of NPH for the subject. Diagnosis for the patients was made on the basis of clinical and imaging findings. The ages of the patients were approximately 50 years old or above. This age range was selected because patients in this age group have an increased likelihood of having NPH. The patients were broken down into the following three groups:

1. A normal control group of 24 subjects. These subjects are not known to have any neurological disease and likely represent normal values.
2. An Alzheimer control group of four subjects. The same subjects and data used in the initial Alzheimer control group was used. These subjects are likely to have Alzheimer disease a definite diagnosis requires post-mortem histopathology. These patients are included as controls because sometimes patients with Alzheimer disease may be erroneously diagnosed as NPH or vice versa.
3. An NPH group of 29 subjects. These subjects are likely to have NPH.

However, since NPH is a clinical diagnosis depending on a patient's symptoms and/or imaging findings, this group may well include some non-NPH patients.

Figure 12:
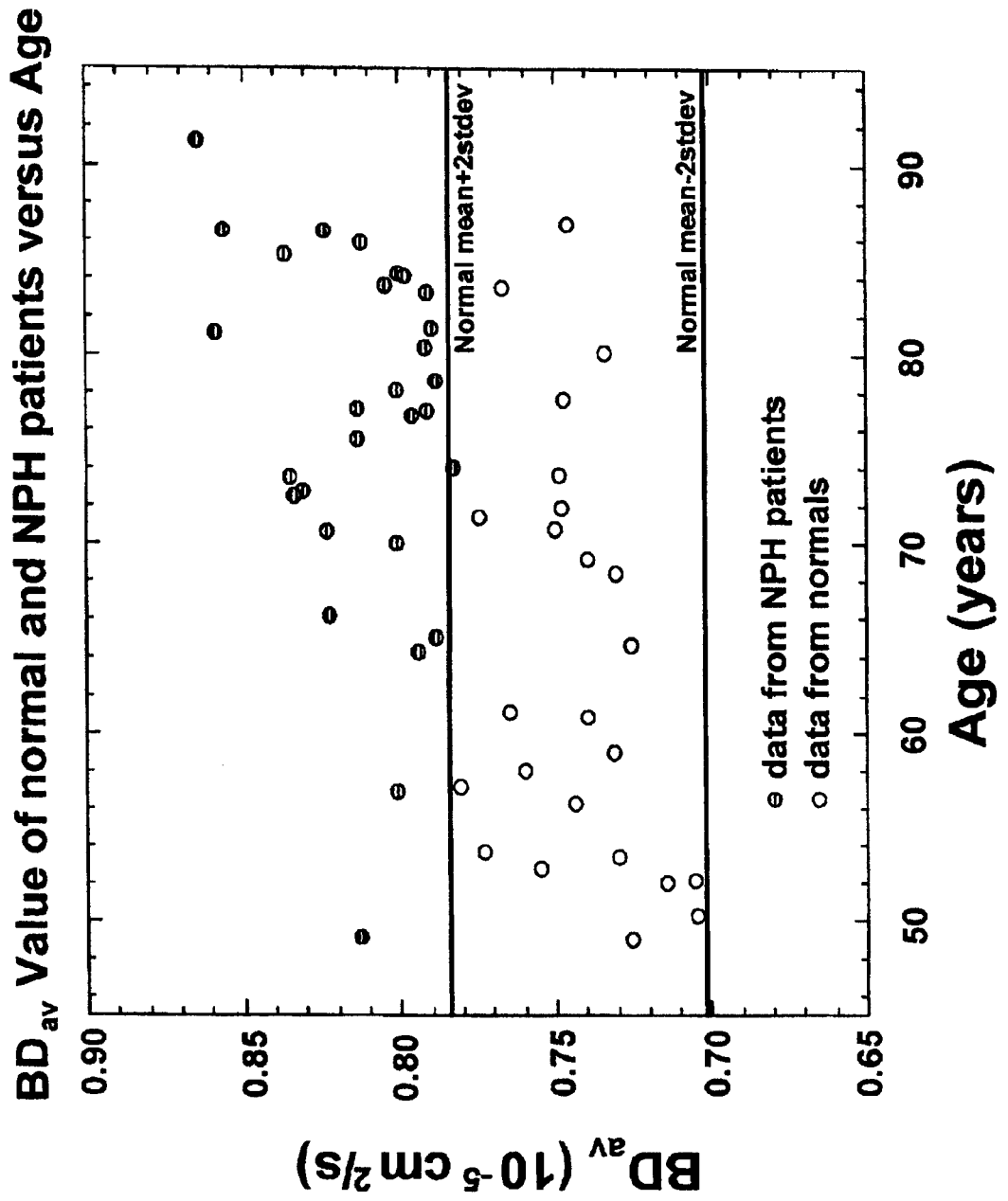
FIG. 12 shows the distribution of the mean brain diffusion constant ($BD_{av}$) for the normal population and NPH subjects in a subsequent study.
Figure 13:
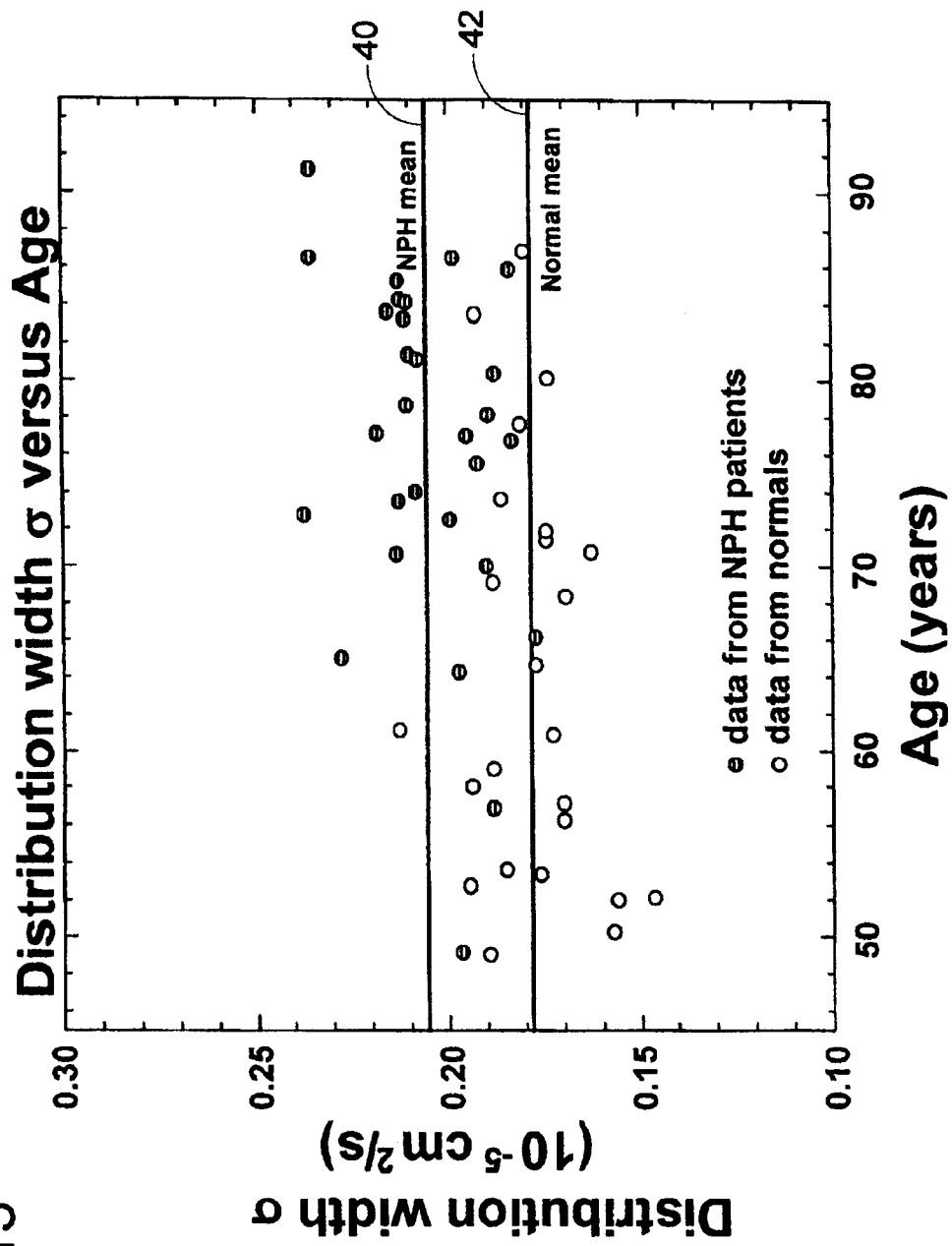
FIG. 13 shows the distribution width $\sigma$ of the mean brain diffusion constant for the normal population and NPH subjects in the subsequent study.

FIG. 12 shows the data points of normal and NPH patients. The data shows that the $BD_{av}$ data for the NPH patients are all above two standards of deviation of the mean $BD_{av}$ of normal patients. The data indicates that individuals can be identified as likely to have normal pressure hydrocephalus if the mean brain diffusion constant of the individual is higher than the normal mean brain diffusion constant characteristic of normal individuals by at least two standard deviations of the normal mean brain diffusion constant. FIG. 13 shows the mean for normal patients and NPH patients. The NPH mean 40 is higher than the normal mean 42.

Figure 14:
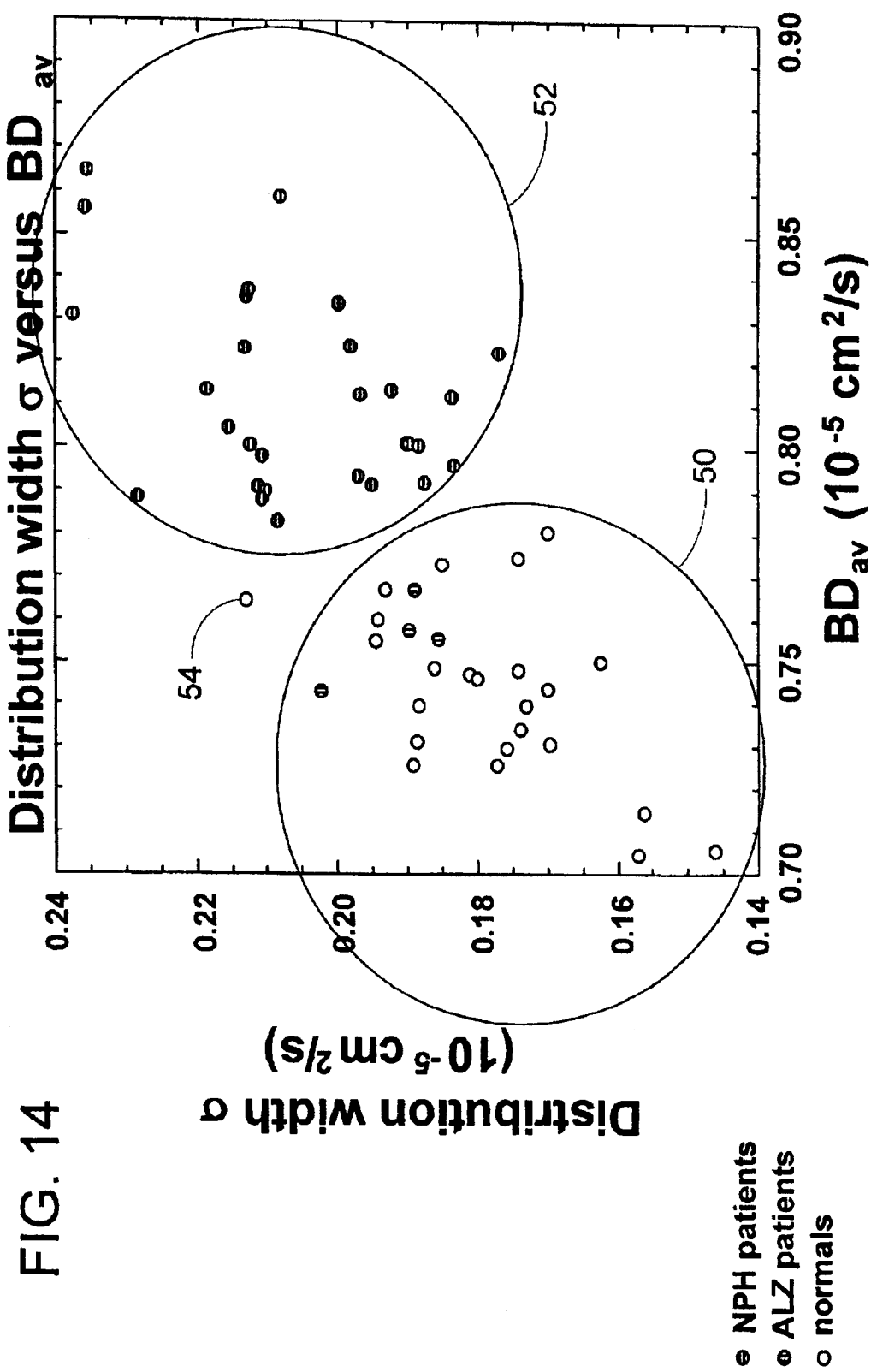
FIG. 14 shows the distribution width $\sigma$ of the mean brain diffusion constant compared to the mean brain diffusion constant ($BD_{av}$) for the normal population and NPH subjects in the subsequent study.

FIG. 14 shows the results of distribution width compared to $BD_{av}$ for the normal patients and the NPH patients. It will be seen that the data from the normal and Alzheimer patients is well separated from the NPH patients. The circles 50, 52, which have the same radius, further illustrate the separation between the normal and NPH patients. It is noted that data point 54 is outside the circle 50 (i.e., data point 54 is an outlier point). In a data set of the size used, data point 54 is not considered a significant deviation. Outlier points such as data point 54 may arise from instrumental errors or other problems. For example, the patient corresponding to point 54 may have some pathological reasons (i.e., some undiagnosed disease) that causes the data to be an outlier point. This data indicates that $BD_{av}$ for the normal group is below approximately $0.78*10^{-5}$ cm$^2$/s and is above approximately $0.78*10^{-5}$ cm$^2$/s for the NPH group. The distribution width for the normal group is below $0.195*10^{-5}$ cm$^2$/s and is above $0.175*10^{-5}$ cm$^2$/s for the NPH group. Individuals can be identified as likely to have normal pressure hydrocephalus if the $BD_{av}$ of the individual is above $0.78*10^{-5}$ cm$^2$/s and the distribution width of the individual is above $0.175*10^{-5}$ cm$^2$/s. Similarly, individuals can be identified as not likely to have normal pressure hydrocephalus if the $BD_{av}$ of the individual is below approximately $0.78*10^{-5}$ cm$^2$/s and the distribution width of the individual is below approximately $0.195*10^{-5}$ cm$^2$/s.

Table 2 provides out a summary of the data which was developed by the inventor on the subsequent study:

TABLE 2

|  | $BD_{av}$ | σ |
|---|---|---|
| Normal control (n = 24) | 0.743 ± 0.021 | 0.178 ± 0.015 |
| Alzheimer control (n = 4) | 0.757 ± 0.015 | 0.192 ± 0.007 |
| NPH group (n = 29) | 0.812 ± 0.023 | 0.206 ± 0.016 |
| % increase compared to normal | 9.3% | 15.5% |

The measured parameters are reported in the units of $10^{-5}$ cm$^2$/s. The mean and standard deviations of the calculated parameters are shown. When normal group is compared with NPH group the differences are statistically significant at $p < 0.05$ level.

The diagnosis of NPH is a clinical diagnosis and it can be made by a neurologist anytime during the course of the disease. A gold standard in diagnosing NPH is to perform a spinal tap test and see if the patient improves afterwards. The spinal tap test basically removes some of the fluid that may be causing NPH. Typically, if a patient receives a spinal test and improves afterwards, the patient is diagnosed as having NPH. Some patients do improve after the spinal tap test for extended period of times. Normally the improvement is short-lived and patient needs to be shunted for long term improvement. In clinical practice the diagnosis of NPH is complicated. This is particularly true in elderly patients with shunt failure where ventricular size and morphology may not be diagnostic.

Figure 15:
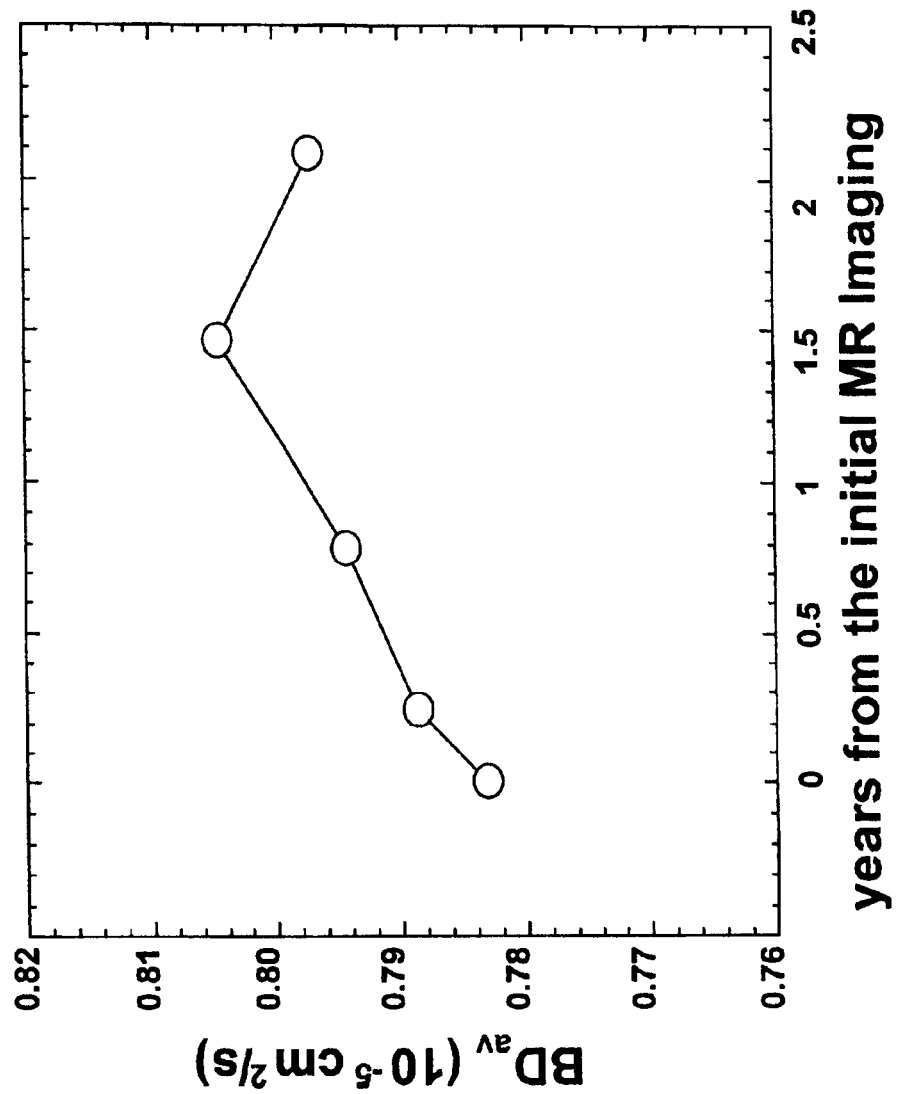
FIG. 15 shows the mean brain diffusion constant ($BD_{av}$) of a NPH patient over a period of time and the decrease in $BD_{av}$ after treatment has started.

FIG. 15 shows the disease progression of a patient. Each data point indicates when MR imaging was performed on the patient and the resulting $BD_{av}$ obtained using the method described herein. In this patient, a spinal tap test was done after the 4th data point was taken, which is more than one and a half years from the initial imaging and analysis. It can be seen that from FIG. 15 that the $BD_{av}$ decreases after the spinal test was performed on the patient, indicating that the patient has NPH.

In this work the quantitative diffusion imaging showed that diffusion in brain tissue is elevated in NPH patients. The diffusion in periventricular tissue was increased in NPH patients as expected from excess transependymal fluid but the mean diffusion of the entire brain tissue ($BD_{av}$) was also increased supporting our hypothesis that NPH leads to increased water content throughout the entire brain. The diffusion constant distribution width (σ) was also increased in NPH patients compared to controls. This may suggest variably increased water content throughout the brain (more water in PVWM compared to cortex for example). The distribution width (σ) is also dependent on brain microstructure, and the increase may indicate the presence of anatomical changes other than edema.

The method of the present invention can also be used in monitoring treatment response in shunted patients. In successfully treated patients the measured parameters $BD_{av}$ and σ would normalize (FIG. 10). In patients where treatment was not optimal (shunt malfunction, disabled-shunt, etc), the measured values would be not-normal (FIG. 11).

Figure 16:
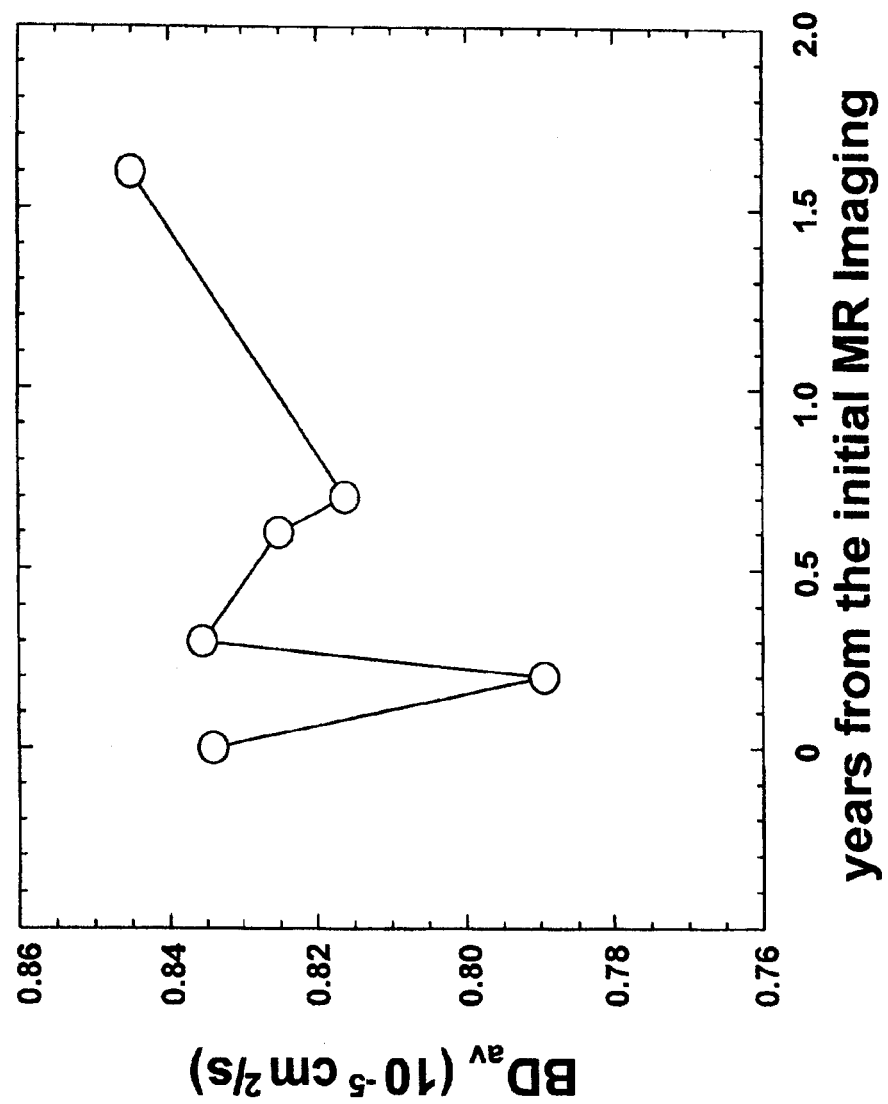
FIG. 16 illustrates the change in $BD_{av}$ of a NPH patient when a shunt has been added and when a shunt fails.
Figure 17:
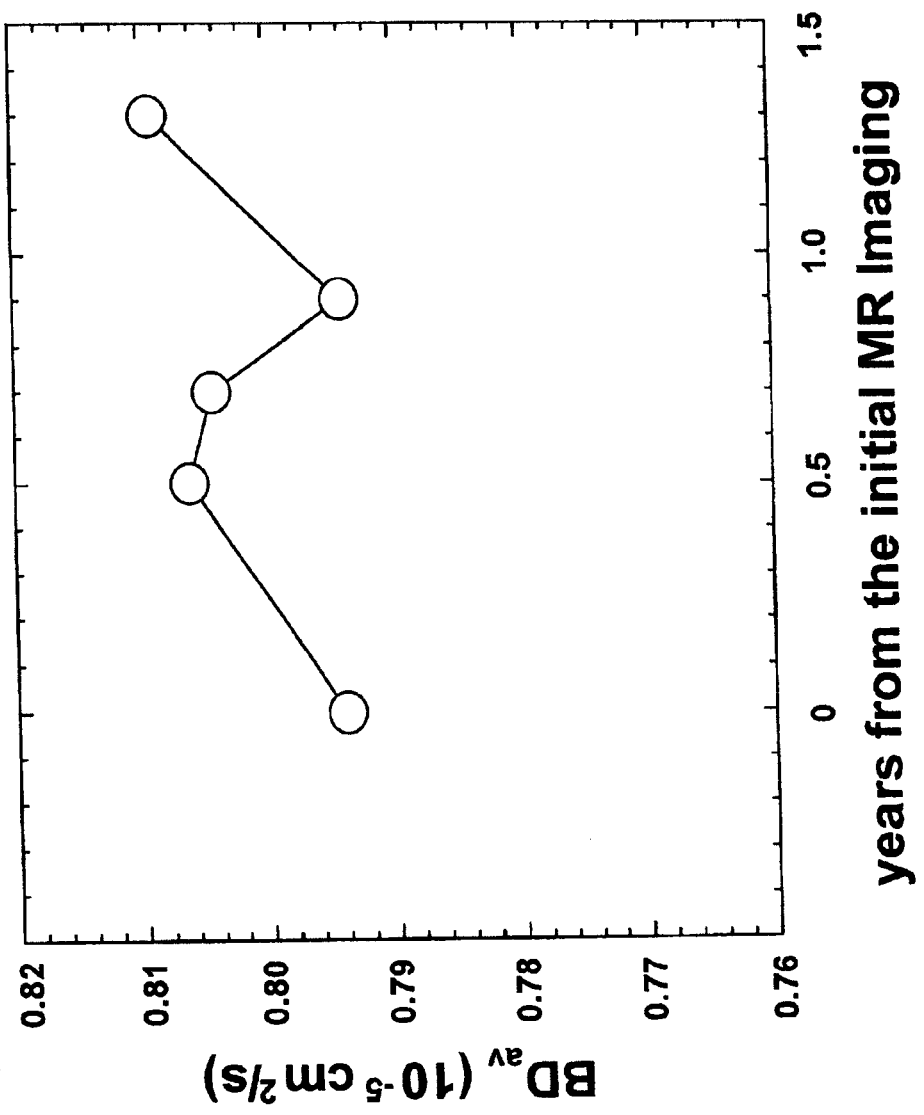
FIG. 17 illustrates the change in $BD_{av}$ of another NPH patient when a shunt has been added and when a shunt fails.

FIGS. 16 and 17 illustrate how tracking $BD_{av}$ in patients over time can be used to monitor the treatment response of patients diagnosed as having NPH. FIG. 16 illustrates how $BD_{av}$ changes over time for one patient diagnosed as having NPH. The first data point in FIG. 16 shows that the $BD_{av}$ for the patient is above the mean $BD_{av}$ for NPH patients. A shunt was installed after the first data was taken and data from subsequent images shows that the $BD_{av}$ of the patient falls toward the $BD_{av}$ characteristics of the normal group. For this particular patient, the shunt was disabled for clinical reasons and data from MR images show that $BD_{av}$ increases above the mean $BD_{av}$ for NPH patients. After the shunt was disabled, the shunt was replaced with a programmable shunt. Non-programmable shunts have a fixed pressure setting and they need to be surgically altered if complications arise. A programmable shunt is a relatively new type of shunt that allows the surgeon to set the shunt to a high pressure setting and gradually reduce the pressure setting over a period of time (e.g., within six months) without the need of further surgery by using magnetic means or other means. Data from further MR imaging shows the $BD_{av}$ decreasing over time. Between the fourth and fifth data points, it can be seen that $BD_{av}$ increases, suggesting that the programmable shunt failed. Clinical diagnosis of the patient confirmed that the shunt failed.

FIG. 17 illustrates how $BD_{av}$ changes over time for another patient diagnosed as having NPH. Initially, the $BD_{av}$ of the patient is characteristic of the NPH group. Data from subsequent MR imaging shows that the $BD_{av}$ of the patient increased closer to the NPH mean $BD_{av}$. After diagnosis by a neurologist, a shunt was surgically placed into the patient. Further sets of scans indicate that the $BD_{av}$ decreased after the shunt was installed. A subsequent set of scans shows an increase in $BD_{av}$, which suggests that the shunt failed. The suggestion of shunt failure was confirmed using clinical means.

To summarize the method, a database is collected of normal data against which data for a diagnosis is to be compared. The data for the normals and the to be diagnosed patients is processed in the same way, as follows. A set of three-dimensional diffusion-weighted images of the brain are obtained. From the images, orientation independent diffusion-weighted images are provided. Those orientation independent diffusion-weighted images are then processed to obtain orientation independent diffusion maps of the entire brain. In these diffusion maps, the intensity of a given pixel shows the average diffusion in that pixel. The orientation independent diffusion maps encompassing the entire brain are then used to produce a diffusion distribution map (e.g., a histogram of pixels). Thus the three-dimensional data from the images is now reduced to one-dimensional data.

This diffusion distribution map of the entire brain is a histogram of the pixel intensity distribution of the entire brain. As the third step, the one-dimensional data is then fitted to a brain model. In this particular case a three compartment model which has a good fit to the actual brain characteristics is used. From the model an average diffusion constant $BD_{av}$ is determined as well as the distribution $\sigma$ of the diffusion constant in the brain tissue. Those constants for a patient being diagnosed are compared to the constants previously collected from normal patients. The constants previously collected from normal patients and patients diagnosed as having NPH are stored in a database. If the average brain diffusion constant for the patient being diagnosed is substantially higher than the normals and the distribution substantially wider, the patient is determined to have constants which are characteristic of the group having NPH. The average brain diffusion constant and distribution width for the patient may be added to the constants previously collected for normal patients if the average brain diffusion constant and distribution width is within the range of constants and distribution widths for normal patients. Similarly, the average brain diffusion constant and distribution width for the patient may be added to the constants previously collected for NPH patients if the average brain diffusion constant and distribution width is within the range of constants and distribution widths for NPH patients.

Once a diagnosis is made and treatment has been initiated, the treatment response of patients can be monitored by tracking $BD_{av}$ over time. If $BD_{av}$ is approaching the $BD_{av}$ characteristic of the normal group, the treatment is on track. An increase in $BD_{av}$ away from the $BD_{av}$ characteristic of the normal group provides an alert that the patient is not responding to the treatment. An increase in $BD_{av}$ suggests that the shunt has been disabled or has malfunctioned. When $BD_{av}$ increases, the treating physician can take appropriate steps to determine what has caused $BD_{av}$ to increase and determine the proper course of action.

What is claimed is:

1. A method to diagnose normal pressure hydrocephalus comprising the steps of:
    processing three-dimensional diffusion magnetic resonance images of the entire brain of an individual to produce a diffusion distribution map of the entire brain for the individual;
    fitting the diffusion distribution map to a model and determining from the model a mean brain diffusion constant for the entire brain of the individual;
    comparing the mean brain diffusion constant with at least one normal brain diffusion constant for normal individuals to determine if the individual is likely to have normal pressure hydrocephalus or is likely to be a normal individual.

2. The method of claim 1 further comprising the step of determining from the model a distribution width and wherein the step of comparing the mean brain diffusion constant with at least one normal brain diffusion constant comprises comparing the mean brain diffusion constant and the distribution width with the at least one normal brain diffusion constant and at least one normal distribution width for normal individuals.

3. The method of claim 2 wherein the at least one normal distribution width comprises a plurality of normal distribution widths stored in a database, the method further comprising the steps of:
    adding the distribution width to the database if the individual is likely to be a normal individual.

4. The method of claim 1 wherein the at least one normal brain diffusion constant comprises a plurality of normal brain diffusion constants stored in a database, the method further comprising the step of adding the mean brain diffusion constant to the database if the individual is likely to be diagnosed as a normal individual.

5. The method of claim 4 further comprising the steps of:
    comparing the mean brain diffusion constant and the distribution width with a plurality of normal pressure hydrocephalus brain diffusion constants and a plurality of normal pressure hydrocephalus distribution widths for individuals diagnosed as having normal pressure hydrocephalus that are stored in the database;
    if the mean brain diffusion constant fits within the plurality of normal pressure hydrocephalus brain diffusion constants and the distribution width fits within the plurality of normal pressure hydrocephalus distribution widths:
        diagnosing the individual as likely having normal pressure hydrocephalus;
        adding the mean brain diffusion constant to the plurality of normal pressure hydrocephalus brain diffusion constants; and
        adding the distribution width to the plurality of normal pressure hydrocephalus distribution widths.

6. The method of claim 1 further comprising the steps of:
    if the individual is likely to have normal pressure hydrocephalus:
        obtaining new three-dimensional diffusion magnetic resonance images of the entire brain of the individual after the individual has undergone a spinal test procedure;
        processing the new three-dimensional diffusion magnetic resonance images to produce a new diffusion distribution map of the entire brain for the individual;
        fitting the new diffusion distribution map to the model and determining from the model a revised mean brain diffusion constant for the entire brain of the individual;
        determining if the revised mean brain diffusion constant is closer to the normal brain diffusion constant than the mean brain diffusion constant; and
        diagnosing the individual as having normal pressure hydrocephalus if the revised mean brain diffusion constant is moves toward the at least one normal brain diffusion constant.

7. The method of claim 1 wherein the step of processing the three-dimensional diffusion magnetic resonance images to produce the diffusion map of the entire brain for the individual comprises the steps of:
    generating an orientation-independent diffusion weighted image from the three-dimensional diffusion magnetic resonance images;
    calculating an orientation-independent average diffusion map on a pixel by pixel basis; and
    creating the diffusion map from the orientation-independent average diffusion map by distributing the pixels to a predetermined number of bins having a predetermined bin width.

8. The method of claim 1 wherein the at least one normal brain diffusion constant is a value equal to a normal mean brain diffusion constant plus two standard deviations of the normal mean brain diffusion constant.

9. The method of claim 8 further comprising the step of identifying the individual as likely to have normal pressure hydrocephalus if the mean brain diffusion constant is higher than the value.

10. The method of claim 8 wherein the normal mean brain diffusion constant is calculated from a plurality of normal brain diffusion constants that are stored in a database, the method further comprising the steps of:

adding the mean brain diffusion constant to the plurality of normal brain diffusion constants if the individual is diagnosed as not having normal pressure hydrocephalus; and recalculating the normal mean brain diffusion constant of the plurality of normal brain diffusion constants and the value if the individual is likely to be diagnosed as a normal individual.

11. The method of claim 1 wherein the step of fitting the diffusion map to a model and determining from the model a mean diffusion constant for the entire brain of the individual comprises the steps of:

fitting the distribution map to a triple gaussian curve to create a fitted distribution map;

determining a mean of the fitted distribution map; and setting the mean diffusion constant to the mean.

12. A computer-readable medium having computer executable instructions for performing steps to diagnose normal pressure hydrocephalus, the steps comprising:

processing three-dimensional diffusion magnetic resonance images of the entire brain of an individual to produce a diffusion distribution map of the entire brain for the individual;

fitting the diffusion distribution map to a model and determining from the model a mean brain diffusion constant for the entire brain of the individual;

comparing the mean brain diffusion constant with at least one normal brain diffusion constant for normal individuals to determine if the individual is likely to have normal pressure hydrocephalus or is likely to be a normal individual.

13. The computer-readable medium of claim 12 wherein the step of processing the three-dimensional diffusion magnetic resonance images to produce the diffusion map of the entire brain for the individual comprises the steps of:

generating an orientation-independent diffusion weighted image from the three-dimensional diffusion magnetic resonance images;

calculating an orientation-independent average diffusion map on a pixel by pixel basis; and creating the diffusion map from the orientation-independent average diffusion map by distributing the pixels to a number of bins having a bin width.

14. The computer-readable medium of claim 12 further comprising the step of determining from the model a distribution width and wherein the step of comparing the mean brain diffusion constant with at least one normal brain diffusion constant comprises comparing the mean brain diffusion constant and the distribution width with the at least one normal brain diffusion constant and at least one normal distribution width for normal individuals.

15. The computer-readable medium of claim 12 wherein the at least one normal brain diffusion constant comprises a plurality of normal brain diffusion constants stored in a database, the method further comprising the step of adding the mean brain diffusion constant to the plurality of normal brain diffusion constants if the individual is diagnosed as not having normal pressure hydrocephalus.

16. The computer-readable medium of claim 15 wherein the step of comparing the mean brain diffusion constant with at least one normal brain diffusion constant comprises comparing the mean brain diffusion constant and the distribution width with the plurality of normal brain diffusion constants and a plurality of normal distribution widths for normal individuals stored in the database, the computer-readable medium having further computer-executable instructions for performing the steps of:

determining the distribution width from the model; and adding the distribution width to the plurality of normal distribution widths if the individual is diagnosed as not having normal pressure hydrocephalus.

17. The computer-readable medium of claim 16 having further computer-executable instructions for performing the steps of:

comparing the mean brain diffusion constant and the distribution width with a plurality of normal pressure hydrocephalus brain diffusion constants and a plurality of normal pressure hydrocephalus distribution widths for individuals diagnosed as having normal pressure hydrocephalus that are stored in the database;

if the mean brain diffusion constant fits within the plurality of normal pressure hydrocephalus brain diffusion constants and the distribution width fits within the plurality of normal pressure hydrocephalus distribution widths:

diagnosing the individual as likely having normal pressure hydrocephalus adding the mean brain diffusion constant to the plurality of normal pressure hydrocephalus brain diffusion constants; and adding the distribution width to the plurality of normal pressure hydrocephalus distribution widths.

18. The computer-readable medium of claim 12 having further computer-executable instructions for performing the steps of:

if the mean brain diffusion constant is greater than the normal brain diffusion constant by a first percentage:

obtaining new three-dimensional diffusion magnetic resonance images of the entire brain of the individual after the individual has undergone a spinal test procedure;

processing the new three-dimensional diffusion magnetic resonance images to produce a new diffusion distribution map of the entire brain for the individual;

fitting the new diffusion distribution map to the model and determining from the model a revised mean brain diffusion constant for the entire brain of the individual;

determining if the revised mean brain diffusion constant is closer to the normal brain diffusion constant than the mean brain diffusion constant; and diagnosing the individual as having normal pressure hydrocephalus if the revised mean brain diffusion constant is closer to the normal brain diffusion constant than the mean brain diffusion constant.

19. The computer-readable medium of claim 12 wherein the at least one normal brain diffusion constant is a value that is equal to a normal mean brain diffusion constant plus two standard deviations of the normal mean brain diffusion constant and the step of comparing the mean brain diffusion constant with at least one normal brain diffusion constant to diagnose normal pressure hydrocephalus comprises the steps of:

comparing the mean brain diffusion constant with the value;

identifying the individual as likely to have normal pressure hydrocephalus if the mean brain diffusion constant is higher than the value.

20. The computer-readable medium of claim 19 wherein the normal mean brain diffusion constant is calculated from a plurality of normal brain diffusion constants that are stored in a database, the computer-readable medium having further computer executable instructions for performing the steps comprising:

adding the mean brain diffusion constant and the distribution width to the database if the individual is diagnosed as not having normal pressure hydrocephalus; and adjusting the normal mean brain diffusion constant and the value if the individual is diagnosed as not having normal pressure hydrocephalus.

21. The computer-readable medium of claim 12 wherein the step of fitting the diffusion map to a model and determining from the model values for a mean diffusion constant and a distribution width for the entire brain of the individual comprises the steps of:

fitting the distribution map to a triple gaussian curve;

determining a mean of the distribution map;

setting the mean brain diffusion constant to the mean; and determining the distribution width from the distribution map.

22. A method to monitor the treatment response of an individual diagnosed as having normal pressure hydrocephalus comprising the steps of:

periodically determining a mean brain diffusion constant from a diffusion distribution map of the entire brain of the individual, the diffusion distribution map produced by processing three-dimensional diffusion magnetic resonance images of the entire brain of the individual;

determining if the mean brain diffusion constant is approaching a normal mean brain diffusion constant characteristic of normal individuals; and providing an alert if the mean brain diffusion constant increases.

23. The method of claim 22 wherein the step of determining the mean brain diffusion constant comprises:

fitting the diffusion map to a model and determining from the model a value for the mean brain diffusion constant of the individual.

24. The method of claim 22 wherein the diffusion map of the entire brain of the individual is produced by generating an orientation-independent diffusion weighted image from the three-dimensional diffusion magnetic resonance images; calculating an orientation-independent average diffusion map on a pixel by pixel basis; and creating the diffusion map from the orientation-independent average diffusion map by distributing the pixels to a number of bins having a bin width.

25. The method of claim 22 further comprising the step of installing a shunt.

* * * * *